(12) United States Patent
Pan et al.

(10) Patent No.: US 12,100,952 B2
(45) Date of Patent: Sep. 24, 2024

(54) METHOD AND SYSTEM FOR MONITORING A SITE BASED ON USE OF AN ELECTRICAL APPLIANCE AT THE SITE

(71) Applicant: UEC System Solutions Corporation, Taipei (TW)

(72) Inventors: Hui-Ming Pan, Taipei (TW); Hsiu-Ping Chou, Taipei (TW); Hung-Yao Wu, Taipei (TW); Tsung-Fang Tu, Taipei (TW); Hui-Hsien Wang, Taipei (TW)

(73) Assignee: UEC SYSTEM SOLUTIONS CORPORATION, Taipei (TW)

(*) Notice: Subject to any disclaimer, the term of this patent is extended or adjusted under 35 U.S.C. 154(b) by 470 days.

(21) Appl. No.: 17/491,037

(22) Filed: Sep. 30, 2021

(65) Prior Publication Data

US 2022/0131378 A1 Apr. 28, 2022

(30) Foreign Application Priority Data

Oct. 22, 2020 (TW) .................................. 109136687

(51) Int. Cl.
*H02J 3/14* (2006.01)
*G01R 31/00* (2006.01)
*G06N 20/00* (2019.01)
*H02J 3/00* (2006.01)
*H02J 3/10* (2006.01)
*H02J 13/00* (2006.01)

(52) U.S. Cl.
CPC .............. *H02J 3/144* (2020.01); *G01R 31/00* (2013.01); *G06N 20/00* (2019.01); *H02J 3/003* (2020.01); *H02J 3/10* (2013.01); *H02J 13/0005* (2020.01)

(58) Field of Classification Search
CPC .... H02J 3/144; H02J 3/003; H02J 3/10; H02J 13/0005; G01R 31/00; G06N 20/00
See application file for complete search history.

(56) References Cited

U.S. PATENT DOCUMENTS

2015/0253364 A1* 9/2015 Hieda ....................... H04Q 9/00
702/62
2018/0259557 A1* 9/2018 Dong .................... G01R 21/133

* cited by examiner

*Primary Examiner* — Michael W Choi
(74) *Attorney, Agent, or Firm* — HSML P.C.

(57) ABSTRACT

A site monitoring method uses an electrical socket device to collect current data of an electrical appliance that is electrically connected to the electrical socket device. Based on the current data, a management server can derive a user behavior in connection with using the electrical appliance, and send out a warning message when the user behavior thus derived is abnormal.

7 Claims, 3 Drawing Sheets

METHOD AND SYSTEM FOR MONITORING A SITE BASED ON USE OF AN ELECTRICAL APPLIANCE AT THE SITE

CROSS-REFERENCE TO RELATED APPLICATION

This application claims priority of Taiwanese Invention Patent Application No. 109136687, filed on Oct. 22, 2020.

FIELD

The disclosure relates to site monitoring, and more particularly to a method and a system for monitoring a site based on use of an electrical appliance at the site.

BACKGROUND

As our society evolves, due to factors such as declining birthrate, lengthening of the average life span, increasing economic independence, and growing attention paid to the quality of retirement life, more and more seniors choose to live alone. Seniors who live alone and who are in good health and have the ability to take care of themselves may value their personal privacy, and decline the use of general home care systems on the market, such as surveillance systems that use surveillance cameras, at their homes.

In order to take into account the privacy of users at home and home care functions for users such as seniors, how to come up with a way to effectively predict the daily life of users through the monitoring of the use of electrical appliances has become an issue to be solved in the relevant industry.

SUMMARY

Therefore, an object of the disclosure is to provide a site monitoring method and a site monitoring system that can alleviate at least one of the drawbacks of the prior art.

According to the disclosure, the method for monitoring a site based on use of an electrical appliance at the site is provided. The method is implemented by an electrical socket device and a management server. The electrical socket device is electrically connected between a power grid and the electrical appliance, has a communication function, and stores current feature data that is related to multiple reference values of an operating current of the electrical appliance. The reference values correspond to different operating modes of the electrical appliance. The management server stores user data that is related to at least one user at the site, appliance data that is related to the electrical appliance, and service record data that is related to a usage history of the electrical appliance. The method includes steps of: A) by the management server, using a machine learning algorithm to analyze the user data and the service record data based on multiple feature parameters that are each related to the at least one user, the electrical appliance, or an appliance environment where the electrical appliance is located, so as to derive multiple behavioral features in relation to using the electrical appliance at the site and establish a behavioral feature recognition model that is configured to recognize the behavioral features; B) by the electrical socket device, continuously detecting a current flowing through the electrical appliance and an environmental condition of the electric socket device to generate a detection result, generating event data related to a usage condition of the electrical appliance based on the current feature data and the detection result, and transmitting the event data to the management server via a communication network; C) by the management server, using the behavioral feature recognition model to determine whether the event data matches at least one of the behavioral features; and D) by the management server, sending a warning message to at least one user end device that is related to the at least one user upon determining that the event data does not match any of the behavioral features.

According to the disclosure, the system for monitoring a site based on use of an electrical appliance at the site is provided to include a networking device, an electrical socket device and a management server. The networking device is to be disposed at the site, is to be connected to a communication network, and supports short-distance wireless communication. The electrical socket device includes a socket module, a connection module, a storage module, a current detecting module, a temperature sensing module, and a processing module. The socket module is to be electrically connected between the electrical appliance and a power grid, and is operable to permit or terminate supply of electric power from the power grid to the electrical appliance. The connection module is to be communicatively connected to one of the networking device and the communication network. The storage module stores current feature data that is related to multiple reference values of an operating current of the electrical appliance. The reference values correspond to different operating modes of the electrical appliance. The current detecting module is electrically connected to the socket module, and continuously detects a current flowing through the electrical appliance, so as to generate a current detection result. The temperature sensing module continuously detects an ambient temperature to generate a temperature detection result. The processing module is electrically connected to the socket module, the connection module, the storage module, the current detecting module and the temperature sensing module, receives the current detection result and the temperature detection result respectively from the current detecting module and the temperature sensing module, generates event data that is related to a usage condition of the electrical appliance based on the current feature data stored in the storage module, the current detection result and the temperature detection result, and transmits the event data to the networking device via the connection module. The management server is connected to the communication network, and includes a database, a storage unit and a processing unit. The database stores user data that is related to at least one user at the site, appliance data that is related to the electrical appliance, and service record data that is related to a usage history of the electrical appliance. The storage unit stores a behavioral feature recognition model that is configured to recognize multiple behavioral features related to behaviors of at least one user using the electrical appliance. The behavioral features and the behavioral feature recognition model are derived and established by using a machine learning algorithm to analyze the user data and the service record data based on multiple feature parameters that are each related to the at least one user, the electrical appliance, or an environment where the electrical appliance is located. The processing unit is electrically connected to the database and the storage unit. The networking device transmits the event data received thereby to the management server via the communication network. The processing unit of the management server uses the behavioral feature recognition model to determine whether the event data matches at least one of the behavioral features, and sends a warning message to at least one user end device that is related to the at least one user upon determining that the event data does not match any of the behavioral features.

Another object of the disclosure is to provide an electrical socket device for use in the site monitoring system according to this disclosure.

According to this disclosure, the electrical socket device for use in a site monitoring system for monitoring a site based on use of an electrical appliance at the site is provided. The site monitoring system includes a management server. The electrical socket device includes a socket module, a connection module, a storage module, a current detecting module, a temperature sensing module and a processing module. The socket module is to be electrically connected between the electrical appliance and a power grid, and is operable to permit or terminate supply of electric power from the power grid to the electrical appliance. The connection module is configured to be connected to the site monitoring system. The storage module stores current feature data that is related to multiple reference values of an operating current of the electrical appliance. The reference values correspond to different operating modes of the electrical appliance. The current detecting module is electrically connected to the socket module, and continuously detects a current flowing through the electrical appliance, so as to generate a current detection result. The temperature sensing module continuously detects an ambient temperature to generate a temperature detection result. The processing module is electrically connected to the socket module, the connection module, the storage module, the current detecting module and the temperature sensing module, receives the current detection result and the temperature detection result respectively from the current detecting module and the temperature sensing module, generates event data that is related to a usage condition of the electrical appliance based on the current feature data stored in the storage module, the current detection result and the temperature detection result, and transmits the event data to the management server via the connection module.

BRIEF DESCRIPTION OF THE DRAWINGS

Other features and advantages of the disclosure will become apparent in the following detailed description of the embodiment(s) with reference to the accompanying drawings, of which.

DETAILED DESCRIPTION

Before the disclosure is described in greater detail, it should be noted that where considered appropriate, reference numerals or terminal portions of reference numerals have been repeated among the figures to indicate corresponding or analogous elements, which may optionally have similar characteristics.

Figure 1:
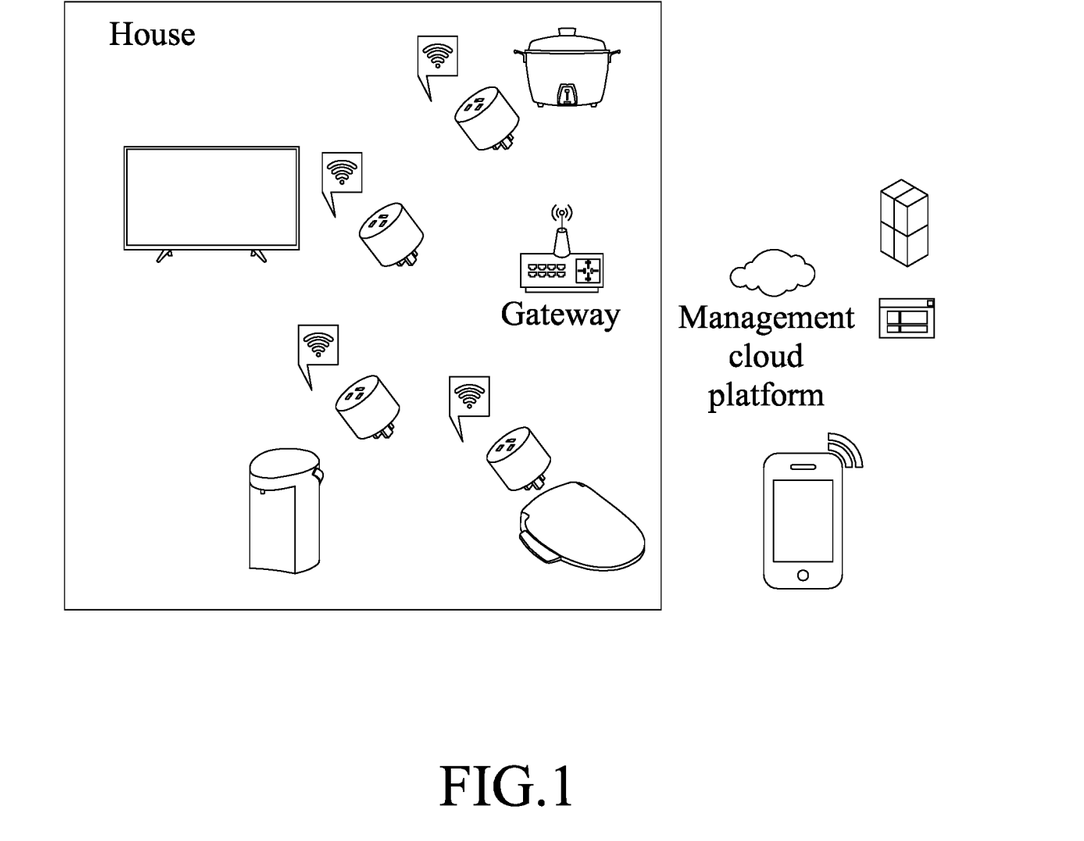
FIG. 1 is a schematic diagram exemplarily illustrating an Internet-of-Things (IoT) system that can be realized in a house.

FIG. 1 exemplarily illustrates an Internet-of-Thing (IoT) system that is adapted for use in a house. The IoT system may include multiple electrical appliances serving as nodes of the IoT system, a management cloud platform, and a gateway that establishes communications among the nodes and the management cloud platform. The electrical appliances may include, for example, televisions, steam cookers, electric water boilers, electric bidets, etc. The management cloud platform can collect and perform computation and analysis on data related to usage conditions of the electrical appliances from the nodes, so as to generate and store usage records of the electrical appliances for subsequent use by relevant users. As an example, the relevant users may use user end devices, such as smartphones, to download or query the usage records.

Figure 2:
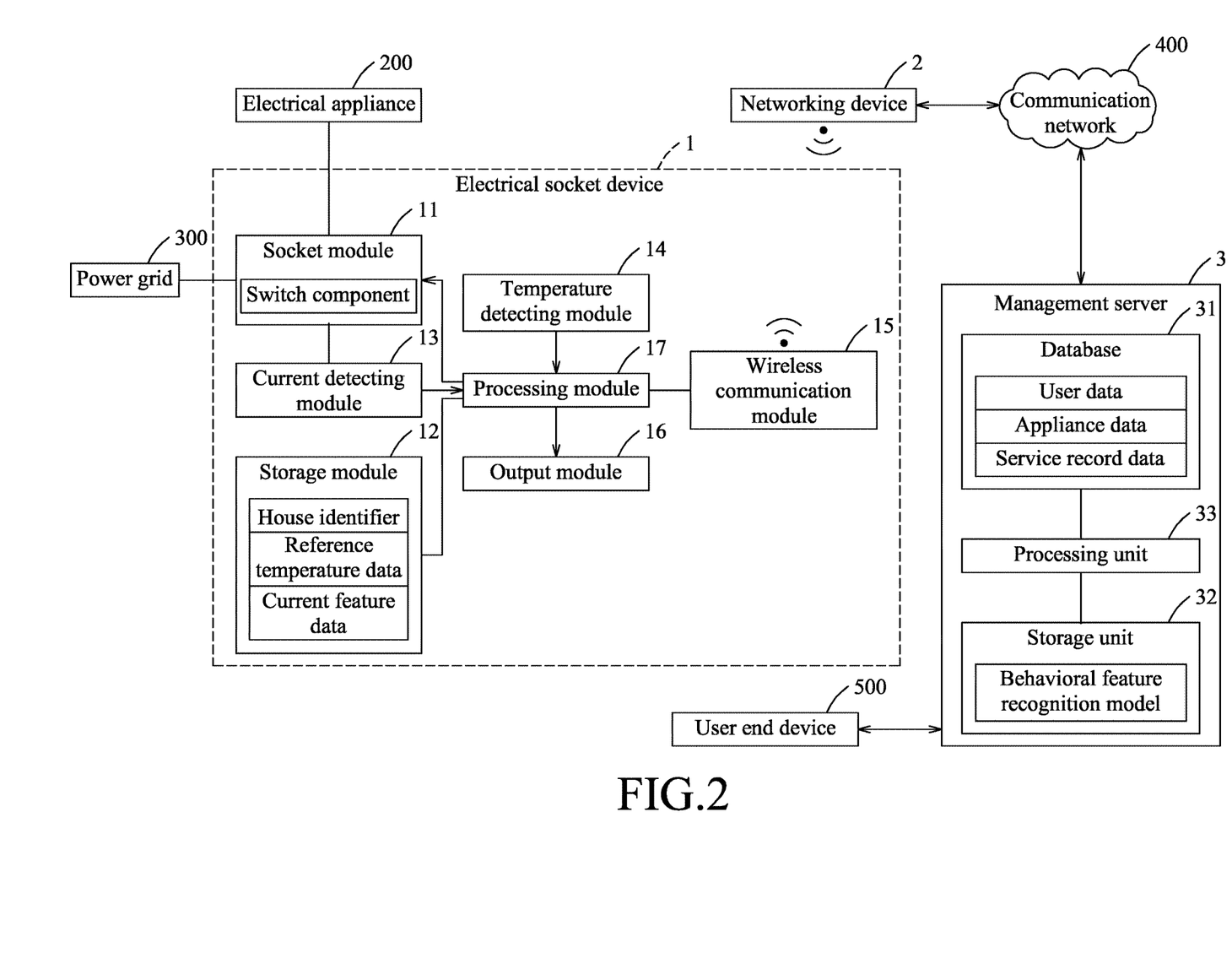
FIG. 2 is a block diagram exemplarily illustrating a structure of an embodiment of a site monitoring system according to this disclosure.

FIG. 2 illustrates an embodiment of a site monitoring system that can be used to realize the IoT system as shown in FIG. 1, and that is adapted to monitor a site based on use of one or more electrical appliances 200 (only one is shown in FIG. 2) at the site. The site monitoring system can also be used as a factory monitoring system or a care institution monitoring system to monitor one or more sites. In this embodiment, the site monitoring system is used as a house monitoring system that exemplarily includes a networking device 2, one or more electrical socket devices 1 (only one is shown in FIG. 2) capable of data transmission, and a management server 3. When the site monitoring system is realized as an IoT system, the management server 3 may serve as the management cloud platform as exemplified in FIG. 1. This embodiment differs from FIG. 1 in that the electrical socket device(s) 1 may serve as the node(s) of the IoT system.

The networking device 2 is adapted to be installed in a house and connected to a communication network 400 (e.g., the Internet), and supports short-distance wireless communication. For example, the networking device 2 may include a wireless router (e.g., a WiFi router), or a gateway (e.g. a narrow-band IoT gateway) that supports, for example, WiFi and/or Bluetooth® technology.

In this embodiment, each electrical socket device 1 includes a socket module 11, a wireless communication module 15 that serves as a connection module, a storage module 12, a current detecting module 13, an environment sensing module 14, and output module 16 and a processing module 17.

The socket module 11 is to be connected between a power grid 300 and the electrical appliance 200. To be specific, the socket module 11 may be configured to include plug pins (not shown) to be inserted into an ordinary wall socket, and a socket (not shown) that allows insertion of plug pins of the electrical appliance 200. As a result, the socket module 11 can be connected to the power grid 300 through the ordinary wall socket in the house, but this disclosure is not limited in this respect. In a case that the socket module 11 is directly connected to the power grid 300, the plug pins can be omitted. The socket module 11 is operable to permit or terminate supply of electric power from the power grid 300 to the electrical appliance 200. For example, the socket module 11 may include a switch component (e.g., a relay) that can be operated by the processing module 17 to switch between a conduction state and a non-conduction state. When the switch component operates in the conduction state, electrical power that is provided by the power grid can be transmitted to the electrical appliance 200 through the switch component. When the switch component operates in the non-conduction state, the supply of the electric power to the electrical appliance 200 is interrupted.

In this embodiment, the wireless communication module 15 can be operated to communicate with the networking device 2 using the short-distance wireless communication (e.g., WiFi protocol and/or Bluetooth® protocol), or can be directly connected to the communication network 400. In some embodiments, the electrical socket device 1 can further include a connecting interface (not shown) for wired connection with the networking device 2, and the connecting interface can serve as the connection module in place of the wireless communication module 15. In some embodiments, the connecting interface can cooperate with the wireless communication module 15 to constitute the connection module. In a case that the wireless communication module 15 is directly connected to the communication network 400, the networking device 2 can be omitted.

The storage module 12 may store, for example, a house identifier that uniquely corresponds to the house, reference temperature data, and current feature data that is related to multiple reference values of an operating current of the electrical appliance 200, where the reference values correspond to different operating modes of the electrical appliance 200. In practice, the storage module 12 may acquire the house identifier and the current feature data through input from or download by a user operating a software application the first time the user uses the system or during a registration stage of the system. The current feature data may include, for example, a type and/or a model of the electrical appliance 200, reference operating current values and/or ranges (or reference operating current threshold values) that correspond to different operating modes, etc. In one example, assuming that the electric appliance 200 is a refrigerator that has a reference operating current of 30 mA when operating in a general power saving mode, a reference operating current of 130 mA when a door of the refrigerating chamber is open, a reference operating current of 1500 mA when the compressor is operating, the reference operating current range may be from 30 mA to 1500 mA. In another example, assuming that the electrical appliance 200 is an electric bidet that has a reference operating current value ranging from about 60 mA to about 70 mA when operating in a standby mode, and a reference operating current value ranging from about 80 mA to about 90 mA when operating in a cold water spray mode, the reference operating current range may be from 60 mA to 90 mA.

The current detecting module 13 is electrically connected to the socket module 11, and is capable of continuously detecting a current flowing through the electrical appliance 200, so as to generate a current detection result. In some embodiments, the current detecting module 13 may be realized using a current sensor integrated circuit (IC), Hall effect sensors, shunt resistors, and so on, but this disclosure is not limited in this respect.

The environment sensing module 14 is capable of continuously detecting an environmental condition of the electrical socket device 1. In this embodiment, the environment sensing module 14 is a temperature sensing module 14 capable of continuously detecting an ambient temperature (e.g., internal temperature or external temperature, namely, a temperature inside the electrical socket device 1 or a temperature nearby the electrical socket device 1) related to the electrical socket device 1, so as to generate a temperature detection result. In some embodiments, the temperature detecting module 14 may be realized using a temperature sensor IC, thermistor-type components, and so on, but this disclosure is not limited in this respect.

The output module 16 is operable by the processing module 17 to generate a perceivable output (e.g., visual output or audible output). For example, the output module 16 may include a light emitting diode (LED) module (not shown) for generating a visual output, and/or a buzzer (not shown) for generating an audible output, but this disclosure is not limited in this respect.

The processing module 17 (e.g., a central processing unit, CPU) is electrically connected to the socket module 11, the wireless communication module 15, the storage module 12, the current detecting module 13, the temperature sensing module 14 and the output module 16, and receives the current detection result and the temperature detection result respectively from the current detecting module 13 and the temperature sensing module 14. Functions and operations of the processing module 17 will be described hereinafter.

The management server 3 is connected to the communication network 400, and includes, for example, a database 31, a storage unit 32 (e.g., a hard disk drive, a solid state drive, a flash memory module, etc.), and a processing unit (e.g., a central processing unit, CPU) 33 electrically connected to the database 31 and the storage unit 32. As an example, the management server 3 may be realized as a single computer or a computer system constituted by multiple computers.

The database 31 stores user data that is related to one or more users in the house (i.e., the site in this embodiment), appliance data that is related to the electrical appliance 200, and service record data that is related to a usage history of the electrical appliance 200. In other words, if the site monitoring system is used to monitor multiple electrical appliances 200 in the house, the database 31 may store multiple pieces of appliance data that respectively correspond to the electrical appliances 200, and multiple pieces of service record data that respectively correspond to the electrical appliances 200. For example, the user data may include gender and age of the user(s), a geographic region and/or location where the house is located, the house identifier, contact information of one or more user end devices 500 (only one is shown in FIG. 2, and can be, for example but not limited to, a smartphone, a tablet computer, a notebook computer, a desktop computer, etc.) that are related to the one or more users (e.g., a phone number of an emergency contact of the user(s)), etc. For each electrical appliance 200, the appliance data may include, for example, a type of the electrical appliance 200, a model of the electrical appliance 200, the reference operating current ranges that correspond to different operating modes of the electrical appliance 200 (e.g., reference ranges of operating current that are collected from a large number of electrical appliances of the same type and the same model). For each electrical appliance 200, the service record data may include, for example, information related to each use in each day (e.g., the ambient temperature, time of use (time of using the electrical appliance 200), operating mode(s), usage duration (a length of time the electrical appliance 200 is being used in one go), etc.) within a predetermined time period in the past, total usage duration for each day within the predetermined time period in the past, etc.

Therefore, with respect to each electrical appliance 200 and for each day, the processing unit 33 can use a machine learning algorithm to analyze the user data and the service record data based on multiple feature parameters that are each related to the at least one user, the electrical appliance 200, and/or an appliance environment where the electrical appliance 200 is located (e.g., the gender and age of the user(s), the geographic region where the house is located, the type and characteristics of the electrical appliance 200, the time(s) of use, the usage duration(s), the total usage duration for that day, the ambient temperature, etc.), so as to derive multiple behavioral features in relation to behaviors of at least one user using the electrical appliance 200 at the site and establish a behavioral feature recognition model that is the machine learning algorithm trained using the user data and the service record data to recognize the behavioral features. The processing unit 33 may store the behavioral feature recognition model in the storage unit 32. In this embodiment, the machine learning algorithm used by the processing unit 33 is capable of making decisions based on time series data, and may be, for example but not limited to, long short-term memory (LSTM), the recurrent neural network (RNN), the gated recurrent unit (GRU), other suitable algorithms, or any combination thereof. The type of the electrical appliance 200 may be related to use of the electrical appliance 200, such as kitchen appliances (e.g., electric pots, ovens, microwave ovens, refrigerators, etc.), audio/video appliances (e.g., televisions, stereo systems, set-top boxes, gaming consoles, etc.), bathroom appliances (e.g., electric bidets, electric water heaters, etc.). The characteristics of the electrical appliance 200 may define a normal operation condition for the electrical appliance 200, which may be related to, for example but not limited to, a normal range of a standby current of the electrical appliance 200, a normal range of an operating current of the electrical appliance 200, a time the electrical appliance 200 is being used, a usage duration of the electrical appliance 200, etc. For instance, refrigerators and electric water heaters are usually not continuously used for a long time, so the characteristics of refrigerators and electric water heaters may relate to having a short usage duration, such as less than one minute for a door open state for the refrigerators, less than ten minutes for the electric water heaters, etc. The behavioral features to be recognized by the behavioral feature recognition model may be related to a routine of the user. For example, in a case that the user regularly watches television from 10 AM to 12 PM, from 2 PM to 5 PM and from 7 PM to 9 PM everyday, and regularly uses the electric water heater for about ten minutes between 7 PM and 8 PM everyday, such routines may be the behavioral features to be recognized by the behavioral feature recognition model. These behavioral features can be represented in a form of, for example but not limited to, combined data of a type of the electrical appliance, time durations, magnitudes of the operating current for different time durations, etc.

Figure 3:
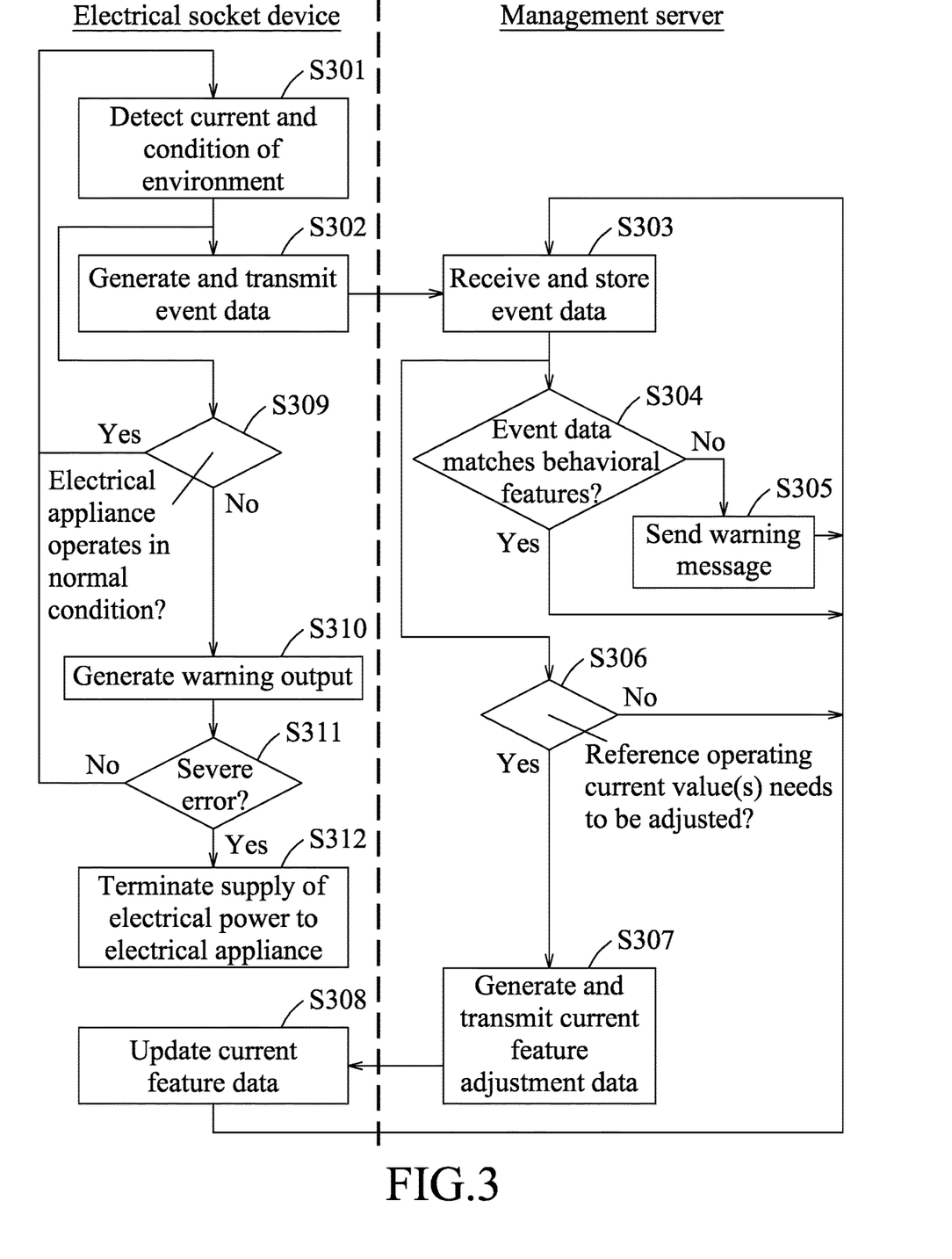
FIG. 3 is a flow chart exemplarily illustrating a method to be implemented by the site monitoring system.

FIG. 3 is a flow chart that illustrates a site monitoring procedure to be implemented by the site monitoring system as exemplified in FIG. 2.

In step S301, the current detecting module 13 continuously detects a current flowing through the electrical appliance 200 through the electrical socket device 1, so as to generate a current detection result, and output the current detection result to the processing module 17. Simultaneously, the temperature sensing module 14 continuously senses an ambient temperature of an environment where the electrical socket device 1 is located, so as to generate a temperature detection result, and output the temperature detection result to the processing module 17. In this embodiment, the current detection result and the temperature detection result cooperatively constitute a comprehensive detection result. The processing module 17 of the electrical socket device 1 continuously receives the current detection result and the temperature detection result respectively from the current detecting module 13 and the temperature sensing module 14.

In step S302, the processing module 17 of the electrical socket device 1 generates event data related to a usage condition of the electrical appliance 200 based on the current feature data that is stored in the storage module 12 and the current detection result and the temperature detection result that are acquired, for example, within each predetermined period (which may be determined or changed based on practical circumstances), and transmits the event data to the management server 3 via the communication network 400. In this embodiment, the processing module 17 transmits the event data for the predetermined period to the networking device 2 through the wireless communication module 15, and the networking device 2 transmits the event data to the management server 3 through the communication network 400. In some embodiments, the event data may include, for example but not limited to, the house identifier, the type and model of the electrical appliance 200, a time of beginning to operate the electrical appliance 200 in each operating mode, actual operating current values and the usage duration of the electrical appliance 200, the internal temperature and the external temperature of the electrical socket device 1.

In step S303, the processing unit 33 of the management server 3 stores the event data as a part of the service record data that corresponds to the electrical appliance 200 upon receipt of the event data from the electrical socket device 1.

In step S304, the processing unit 33 of the management server 3 uses the behavioral feature recognition model that is stored in the storage unit 32 to determine whether the event data matches at least one of the behavioral features. For example, the management server 3 may compare the event data (e.g., a time of beginning to operate the electrical appliance 200, a duration the electrical appliance 200 is continuously used, the operating current of the electrical appliance 200 in the duration) with the behavioral features that are represented in the form of the combined data to determine whether the event data matches at least one of the behavioral features (e.g., whether the time of beginning to operate the electrical appliance 200 and the duration the electrical appliance 200 is continuously used conforms to a duration defined by a behavioral feature, and whether a magnitude of the operating current conforms to a current magnitude defined by the behavioral feature, etc.). The flow goes back to step S303 when the determination is affirmative, and goes to step S305 when otherwise.

When the processing unit 33 determines that the event data does not match any of the behavioral features, it can be derived that the user(s) at the site have abnormal behavior in relation to using the electrical appliance 200. For example, assuming that the electrical appliance 200 is a refrigerator, the event data may be determined as not matching any of the behavioral features when the event data indicates that all of the doors of the refrigerating chamber and the freezer chamber of the refrigerator have not been opened in a single day, and such a behavior in using the refrigerator will thus be derived as being abnormal.

In step S305, the processing unit 33 of the management server 3 sends a warning message to the user end device(s) 500 based on the contact information stored in the database 31 to notify the relevant contact person(s) (e.g., relatives of the user(s) at the site, staff of an associated care institution, etc.) of such an abnormal condition, so they can proceed with necessary actions. Then, the flow goes back to step S303.

On the other hand, in step S306 that follows step S303, the processing unit 33 of the management server 3 determines, based on the event data and the appliance data that corresponds to the electrical appliance 200 and that is stored in the database 31, whether operating current information that is related to the operating current of the electrical appliance 200 (e.g., the reference operating current values and/or ranges of the current feature data stored in the storage module 12, the reference operating current ranges of the appliance data stored in the database 31, etc.) needs to be adjusted. After a long period of use of the electrical appliance 200, the operating current of the electrical appliance 200 for each operating mode may increase because of aging of components, so the processing unit 33 can compare the actual operating current values included in the event data with the service record data stored in the database 31 to acquire the trend of increase of the operating current, and determine whether it is necessary to adjust the operating current information. In the abovementioned example where the electrical appliance 200 is an electric bidet whose reference operating current value is between 60 mA and 70 mA when operating in the standby mode, and whose reference operating current value is between 80 mA and 90 mA when operating in the cold water spray mode, after a long period of use, the operating currents of the electric bidet in the different modes may surpass the 70 mA and 90 mA marks because of aging of components. For example, the operating current in the standby mode may increase to about between 70 mA and 80 mA, and the operating current in the cold water spray mode may increase to about between 85 mA and 95 mA. In such a condition, if the reference operating current values (e.g., the reference operating current values of the standby mode and the cold water spray mode) included in the current feature data that is stored in the storage module 12 are not adjusted, the processing module 17 may misjudge the operating mode of the electric bidet.

The flow goes to step S307 when the determination made in step S306 is affirmative, and goes back to step S303 when otherwise.

In step S307, the processing unit 33 of the management server 3 generates current feature adjustment data that indicates adjustment of the operating current information, transmits the current feature adjustment data to the electrical socket device 1, and uses the current feature adjustment data to update the corresponding reference operating current range(s) included in the appliance data that is stored in the database 31. In this embodiment, the processing unit 33 transmits the current feature adjustment data to the networking device 2 through the communication network 400, the networking device 2 transmits the current feature adjustment data to the processing module 17 of the electrical socket device 1 through the wireless communication module 15.

In step S308, upon receipt of the current feature adjustment data, the processing module 17 of the electrical socket device 1 uses the current feature adjustment data to update the reference operating current values and/or ranges in the current feature data stored in the storage module 12. Then, the flow returns to step S303.

The execution of steps S306 and S307 may achieve data optimization, so the electrical socket device 1 can determine the operating mode of the electrical appliance 200 with higher accuracy, and the correct determination of the operating mode can help the management server 3 make correct determination in connection with whether the event data matches with the behavioral features.

In step S309 that follows step S301, the processing module 17 of the electrical socket device 1 determines whether the electrical appliance 200 operates in a normal condition or an abnormal condition based on the current detection result, the temperature detection result and the current feature data stored in the storage module 12. The flow returns to step S301 when the determination is affirmative, and goes to step S310 when otherwise.

In one example, when the actual operating current value included in the current detection result exceeds an upper limit of the reference operating current range included in the current feature data, the processing module 17 may determine that the electrical appliance 200 operates in an abnormal condition that is related to overcurrent. In one example, when the internal temperature included in the temperature detection result is higher than a relevant temperature value indicated by the reference temperature data that is stored in the storage module 12, the processing module 17 may determine that the electrical appliance 200 operates in an abnormal condition that is related to overheat.

In step S310, the processing module 17 of the electrical socket device 1 causes the output module 15 to generate a warning output (e.g., beeping by the buzzer or flashing by the LED module) that indicates the abnormal condition. For example, when it is determined in step S309 that the electrical appliance 200 operates in the abnormal condition that is related to overcurrent and/or overheat, the processing module 17 may control the output module 15 to generate a warning output of beeping, so as to notify the user to take subsequent inspecting and repairing actions with respect to the electrical appliance 200. When it is determined in step S309 that the electrical appliance 200 operates in the abnormal condition that is related to overheat, the processing module 17 may control the socket module 11 to terminate supply of electric power to the electrical appliance 200 by breaking electrical connection between the power grid 300 and the electrical appliance 200, so as to ensure safety in using the electrical appliance 200.

In step S311, the processing module 17 of the electrical socket device 1 determines whether the abnormal condition determined in step S309 is a severe error. The flow goes to step S312 when the determination is affirmative, and goes back to step S301 when otherwise. In one example where the abnormal condition determined in step S309 is related to overcurrent, the processing module 17 may compare the actual operating current value included in the current detection result with an acceptable current level, and determine that the abnormal condition is a severe error when the actual operating current value exceeds the acceptable current level. In another example where the abnormal condition determined in step S309 is related to overheat, the processing module 17 may compare the internal temperature included in the temperature detection result with an acceptable temperature level, and determine that the abnormal condition is a severe error when the internal temperature is higher than the acceptable temperature level. The acceptable current level and the acceptable temperature level may be determined and updated by the management server 3 based on the appliance data and the service record data. Then, the management server 3 provides the acceptable current level and the acceptable temperature level thus determined/updated to the processing module 17, so the processing module 17 can determine whether the abnormal condition determined in step S309 is a severe error.

In step S312, the processing module 17 of the electrical socket device 1 causes the socket module 11 to terminate supply of electric power to the electrical appliance 200. For example, the processing module 17 may terminate supply of electric power to the electrical appliance 200 by turning off the switch component of the socket module 11 to break electrical connection between the power grid 300 and the electrical appliance 200, so safety in using the electrical appliance 200 can be ensured.

In some embodiments, the user end device(s) 500 can be installed with an application to control on/off of the switch component of the socket module 11. For example, the user end device(s) 500 may execute the application to issue, to the management server 3, a request for turning on/off the switch component via the communication network 400.

Then, in response to the request, the management server 3 issues a command of turning on/off the switch component and transmits the command to the processing module 17 via the communication network 400, the networking device 2, and the wireless communication module 15. Upon receipt the command from the management server 3, the processing module 17 turns on/off the switch component of the socket module 11 accordingly.

In summary, since each electrical socket device 1 will continuously transmit the event data that is related to the electrical appliance 200 connected thereto to the management server 3, the management server 3 can derive whether the behavior of the user at the site related to using the electrical appliance 200 is normal by determining whether the event data matches the behavioral features. The determination may indicate whether the user performs his/her routines normally. Therefore, the site monitoring or the house monitoring can be performed without bothering the user while the privacy of the user is ensured. Furthermore, the management server 3 can analyze the event data to perform data optimization on the current feature data that is used by the electrical socket device 1 in determining the operating mode of the electrical appliance 200, so as to ensure accuracy of determining the user behavior in using the electrical appliance 200.

In the description above, for the purposes of explanation, numerous specific details have been set forth in order to provide a thorough understanding of the embodiment(s). It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects, and that one or more features or specific details from one embodiment may be practiced together with one or more features or specific details from another embodiment, where appropriate, in the practice of the disclosure.

While the disclosure has been described in connection with what is (are) considered the exemplary embodiment(s), it is understood that this disclosure is not limited to the disclosed embodiment(s) but is intended to cover various arrangements included within the spirit and scope of the broadest interpretation so as to encompass all such modifications and equivalent arrangements.

What is claimed is:

1. A method for monitoring a site based on use of an electrical appliance at the site, said method being implemented by an electrical socket device and a management server, the electrical socket device being electrically connected between a power grid and the electrical appliance, having a communication function, and storing current feature data that is related to multiple reference values of an operating current of the electrical appliance, the reference values corresponding to different operating modes of the electrical appliance, the management server storing user data that is related to at least one user at the site, appliance data that is related to the electrical appliance, and service record data that is related to a usage history of the electrical appliance, said method comprising steps of:

A) by the management server, using a machine learning algorithm to analyze the user data and the service record data based on multiple feature parameters that are each related to the at least one user, the electrical appliance, or an appliance environment where the electrical appliance is located, so as to derive multiple behavioral features in relation to using the electrical appliance at the site and establish a behavioral feature recognition model that is configured to recognize the behavioral features;

B) by the electrical socket device, continuously detecting a current flowing through the electrical appliance and an environmental condition of the electric socket device to generate a detection result, generating event data related to a usage condition of the electrical appliance based on the current feature data and the detection result, and transmitting the event data to the management server via a communication network;

C) by the management server, using the behavioral feature recognition model to determine whether the event data matches at least one of the behavioral features; and D) by the management server, sending a warning message to at least one user end device that is related to the at least one user upon determining that the event data does not match any of the behavioral features;

wherein said method further comprises, after step B), steps of:

E) by the management server, storing the event data as a part of the service record data upon receipt of the event data from the electrical socket device;

F) by the management server, determining, based on the event data and the appliance data, whether operating current information that is related to the operating current of the electrical appliance needs to be adjusted;

G) by the management server, upon determining that the operating current information needs to be adjusted, generating current feature adjustment data that indicates adjustment of the operating current information, and transmitting the current feature adjustment data to the electrical socket device; and H) by the electrical socket device, upon receipt of the current feature adjustment data, using the current feature adjustment data to update the current feature data.

2. The method of claim 1, wherein step B) further includes sub-steps of:

by the electrical socket device, determining whether the electrical appliance operates in a normal condition or an abnormal condition based on the detection result and the current feature data; and by the electrical socket device, upon determining that the electrical appliance operates in the abnormal condition, generating a warning output that indicates the abnormal condition.

3. The method of claim 2, wherein step B) further includes sub-steps of:

by the electrical socket device, when determining that the electrical appliance operates in the abnormal condition, determining whether the abnormal condition is a severe error; and by the electrical socket device, upon determining that the abnormal condition is a severe error, terminating supply of electric power to the electrical appliance.

4. A system for monitoring a site based on use of an electrical appliance at the site, comprising:
- a networking device to be disposed at the site, to be connected to a communication network, and supporting short-distance wireless communication;
- an electrical socket device, including:
  - a socket module to be electrically connected between the electrical appliance and a power grid, and operable to permit or terminate supply of electric power from the power grid to the electrical appliance;
  - a connection module to be communicatively connected to one of said networking device and the communication network;
  - a storage module storing current feature data that is related to multiple reference values of an operating current of the electrical appliance, the reference values corresponding to different operating modes of the electrical appliance;
  - a current detecting module electrically connected to said socket module, and continuously detecting a current flowing through the electrical appliance, so as to generate a current detection result;
  - a temperature sensing module continuously detecting an ambient temperature to generate a temperature detection result; and
  - a processing module electrically connected to said socket module, said connection module, said storage module, said current detecting module and said temperature sensing module, receiving the current detection result and the temperature detection result respectively from said current detecting module and said temperature sensing module, generating event data that is related to a usage condition of the electrical appliance based on the current feature data stored in said storage module, the current detection result and the temperature detection result, and transmitting the event data to said networking device via said connection module; and
- a management server connected to the communication network, and including:
  - a database storing user data that is related to at least one user at the site, appliance data that is related to the electrical appliance, and service record data that is related to a usage history of the electrical appliance;
  - a storage unit storing a behavioral feature recognition model that is configured to recognize multiple behavioral features related to behaviors of at least one user using the electrical appliance, wherein the behavioral features and the behavioral feature recognition model are derived and established by using a machine learning algorithm to analyze the user data and the service record data based on multiple feature parameters that are each related to the at least one user, the electrical appliance, or an environment where the electrical appliance is located; and
  - a processing unit electrically connected to said database and said storage unit;
- wherein said networking device transmits the event data received thereby to said management server via the communication network;
- wherein said processing unit of said management server uses the behavioral feature recognition model to determine whether the event data matches at least one of the behavioral features, and sends a warning message to at least one user end device that is related to the at least one user upon determining that the event data does not match any of the behavioral features;
- wherein, when said management server receives the event data from said networking device, said processing unit of said management server stores the event data as a part of the service record data, determines, based on the event data and the appliance data, whether operating current information that is related to the operating current of the electrical appliance needs to be adjusted, and generates, upon determining that the operating current information needs to be adjusted, current feature adjustment data that indicates adjustment of the operating current information, and transmits the current feature adjustment data to said networking device;
- wherein said networking device transmits the current feature adjustment data received from said management server to said connection module of said electrical socket device; and
- wherein said processing module of said electrical socket device uses the current feature adjustment data received from said networking device to update the current feature data stored in said storage module.

5. The system of claim 4, wherein said electrical socket device further includes an output module that is electrically connected to and operable by said processing module; and
- wherein said processing module of said electrical socket device determines whether the electrical appliance operates in a normal condition or an abnormal condition based on the current detection result, the temperature detection result and the current feature data, and, upon determining that the electrical appliance operates in the abnormal condition, makes said output module generate a warning output that indicates the abnormal condition.

6. The system of claim 5, wherein, when determining that the electrical appliance operates in the abnormal condition and that the abnormal condition is a severe error, said processing module of said electrical socket device controls said socket module to terminate supply of electric power to the electrical appliance.

7. The system of claim 4, wherein said connection module of said electrical socket device includes at least one of a connection interface configured for connection with said networking device, or a wireless communication module configured to connect with one of said networking device and the communication network.

* * * * *